US006970054B2

(12) United States Patent
Cherniski et al.

(10) Patent No.: US 6,970,054 B2
(45) Date of Patent: Nov. 29, 2005

(54) APPARATUS FOR TERMINATING TRANSMISSION LINES TO REDUCE ELECTROMAGNETIC INTERFERENCE IN AN ELECTRONIC SYSTEM

(75) Inventors: Andrew Michael Cherniski, Rescue, CA (US); Ricardo Espinoza-Ibarra, Carmichael, CA (US); Andrew Harvey Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 10/263,985

(22) Filed: Oct. 2, 2002

(65) Prior Publication Data

US 2004/0066246 A1 Apr. 8, 2004

(51) Int. Cl.[7] .................................... H04B 3/30
(52) U.S. Cl. .................................... 333/12; 333/22 R
(58) Field of Search .................................... 333/12, 22 R, 333/124, 130, 263; 370/221, 222, 404, 447

(56) References Cited

U.S. PATENT DOCUMENTS 5,563,876 A * 10/1996 Duxbury et al. ............ 370/402
5,747,893 A * 5/1998 Bennett et al. ............ 307/100
6,014,383 A * 1/2000 McCarty ..................... 370/453
6,381,283 B1 * 4/2002 Bhardwaj et al. ........... 375/257
6,486,746 B1 * 11/2002 Gilbert ..................... 333/22 R
6,490,247 B1 * 12/2002 Gilbert et al. ............. 370/222

OTHER PUBLICATIONS

Fairchild Semiconductor Corporation. Characteristics and Measurement Techniques of the Spectral Content of Signals Generated by High-Performance ICS. www.fairchildsemi.com. Jun. 1992 (Revised Nov. 1999).

* cited by examiner

*Primary Examiner*—Dean Takaoka

(57) ABSTRACT

An apparatus for terminating a transmission line includes a terminating circuit coupled to a first connector portion. A second connector portion mates with the first connector portion. The second connector portion is coupled in electrical contact with the transmission line and includes one or more components, such as pins, that can radiate unwanted electromagnetic interference (EMI) when the transmission line is not terminated. The terminating circuit includes components, such as one or more resistors, that substantially match the impedance of the transmission line. The terminating circuit can also be configured to terminate other conductive lines that can pick up signal noise in a system. The terminating apparatus can be utilized on operational boards that plug into devices such as backplanes or midplanes. Alternatively, the terminating circuit can be included on a null device or built into the first connector portion.

32 Claims, 6 Drawing Sheets

APPARATUS FOR TERMINATING TRANSMISSION LINES TO REDUCE ELECTROMAGNETIC INTERFERENCE IN AN ELECTRONIC SYSTEM

BACKGROUND OF THE INVENTION

1. Field of the Invention

The invention relates generally to devices for terminating transmission lines and specifically for terminating a transmission line to reduce electromagnetic interference in electronic systems and networks.

2. Relevant Background

Whenever an electric charge is accelerated, electromagnetic waves are generated. Typical electric and magnetic fields in electronic circuits are generated by current pulses propagating along a path or a loop within the circuit. Each current pulse that propagates along the path creates a magnetic field perpendicular to the plane of the current path. The resulting voltage drop along the path creates an electric field opposite to the propagation direction and within the same current plane. Most common current paths within a personal computer consist of I/O cables, printed circuit board (PCB) signal traces, power supply cables, and power-to-ground loops. These paths can act as antennae, radiating electric and magnetic fields that cause EMI by interacting with other signals. The magnitude of EMI is a function of several characteristics of the transmitted signal, such as its frequency, duty cycle, edge rate, and voltage swing (amplitude). This EMI may result in erroneous transmission of data, lost data, or a reduction in the amount of acceptable noise for that system.

As the computer market evolves, increasingly higher-speed data processing and transmission technologies are being developed. Electronic components and circuits, such as microprocessors, operate at increasingly higher frequencies and lower voltages and are increasingly more susceptible to electromagnetic interference (EMI). Unfortunately, nearly any computer system has the potential for causing EMI during operation.

Another source of EMI, aside from I/O cables, PCB signal traces, power supply cables, and power-to-ground loops, can arise when high-speed data is transmitted to the pins of an unterminated connector. In this situation, the open pins act as small antennae that radiate the transmitted signals. These open pins have been observed to generate up to 10 decibels or more of EMI. The EMI can interfere with other components within the computer system as well as other susceptible electronic systems that may be nearby. Thus, whether the open pins reside within or outside of a computer system housing, it is desirable, and in some situations necessary, to reduce these emissions to acceptable levels.

In the prior art, various techniques are recommended to reduce EMI in data transmission lines. See "Characteristics and Measurement Techniques of the Spectral Content of Signals Generated by High-Performance ICs", Fairchild Semiconductor Application Note, June 1992 (AN-831), revised November 1999 (AN010998). One technique known as the parallel termination scheme matches the effective impedance of the transmission line with a resistor coupled in parallel. Another technique known as the series termination scheme places a resistor in series with the output driver and the transmission line. The resistor value is selected such that when added to the integrated circuit (IC) output resistance, the total equals the effective impedance of the transmission line. This effectively forms a voltage divider with the transmission line producing a half-voltage level at the source which doubles upon reflection at the end of the line. These techniques are applicable to distributed or point-to-point data transmissions, respectively, but do not address the issue of open connector pins at the end of the transmission cable.

Similarly, other components such as ferrite cores and beads, feed through capacitors, connector shields, gaskets, and conductive tapes can all prevent unwanted EMI signals, as known in the art. These techniques are not suitable, however, for use on connector pins because the components would interfere with mating the pins to a corresponding connector. It is therefore desirable to provide a device for reducing, and even eliminating, EMI propagated by data being transmitted to an unterminated portion of a connector.

SUMMARY

An apparatus for terminating a transmission line to reduce EMI includes a terminating circuit coupled to a first connector portion. A second connector portion mates with the first connector portion. The second connector portion is coupled in electrical contact with the transmission line and includes one or more components, such as pins, that can radiate unwanted electromagnetic interference (EMI) when the transmission line is not terminated. The terminating circuit includes components, such as one or more resistors, that substantially match the impedance of the transmission line. The terminating circuit can also be configured to terminate other conductive lines coupled to the second connector portion that can pick up signal noise in a system. The terminating apparatus can be utilized on operational boards that plug into devices such as backplanes or midplanes. Alternatively, the terminating circuit can be included on a null device or built into the first connector portion.

In accordance with one embodiment of an apparatus for terminating a transmission line, a first connector portion includes an electrically conductive portion. The first connector portion can be coupled to a second connector portion that is in electrical contact with the transmission line. A terminating circuit is coupled in electrical contact with the electrically conductive portion of the first connector portion, thereby terminating the transmission line when the first connector portion is coupled to the second connector portion.

In one aspect of an apparatus for terminating a transmission line, the terminating circuit substantially matches the impedance of the transmission line.

In another aspect of an apparatus for terminating a transmission line, the terminating circuit includes a resistor. The terminating circuit can be implemented in a printed circuit board using any suitable manufacturing method such as surface mounted components, embedded components, or a combination of surface mounted and embedded components.

In another aspect of an apparatus for terminating a transmission line, the terminating circuit can be included on a variety of devices that plug into a system. One example of such a device is a null device, e.g., an airflow guide. Another example is a blade designed to be utilized in a blade server system.

In another embodiment, a computer system in accordance with an embodiment of the present invention includes a pin connector portion, a socket connector portion, and a terminating circuit in electrical contact with the socket connector portion. A port bypass circuit is coupled to the transmission line.

In one aspect of the computer system, the port bypass circuit is part of a hub, such as a fiber channel arbitrated loop hub that receives data via optical fiber and transmits data via electrically conductive wire.

In another aspect, the terminating circuit substantially matches the impedance of the transmission line, and can be configured to terminate other lines that are in contact with the second connector portion.

In another embodiment, a method for terminating a transmission line includes coupling a terminating circuit to a second connector portion and mating the second connector portion to the first connector portion. The transmission line is electrically coupled to the first connector portion.

In one aspect, the method for terminating a transmission line includes determining the impedance of the transmission line, and selecting components, such as one or more resistors, for the terminating circuit that substantially match the impedance of the transmission line.

In another aspect, the method for terminating a transmission line includes implementing the terminating circuit in a printed circuit board using any suitable manufacturing method such as surface mounted components, embedded components, or a combination of surface mounted and embedded components.

In another aspect, the method for terminating a transmission line includes configuring the terminating circuit on a variety of devices that plug into a system. One example of such a device is a null device, e.g., an airflow guide. Another example is a blade designed to be utilized in a blade server system, such as a processing blade or a storage blade.

In yet another aspect, the method for terminating a transmission line includes coupling a port bypass circuit to the transmission line. The port bypass circuit can be part of a hub, such as a fiber channel arbitrated loop hub, that receives data via optical fiber and transmits data via electrically conductive wire.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION

Figure 1:
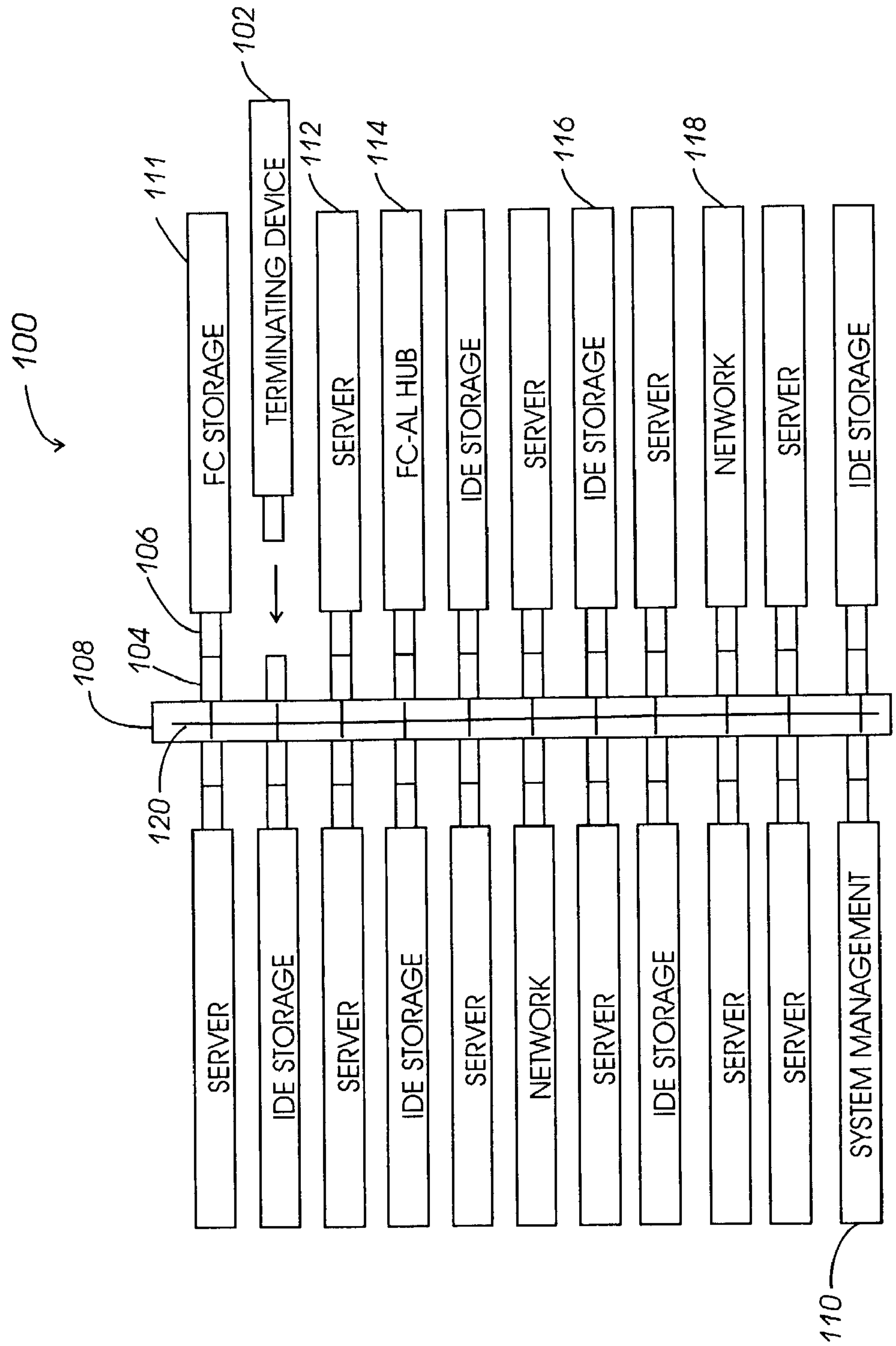
FIG. 1 is a block diagram of an example of a server system that can utilize a terminating device in accordance with an embodiment of the present invention.

Referring now to FIG. 1, a block diagram of server system 100 is shown in which terminating device 102 can be utilized to reduce electromagnetic interference (EMI) in accordance with an embodiment of the present invention. Server system 100 includes slots in which removable blades can be inserted. When one or more of the blades is disconnected from mid-plane 108, connector portion 104 on mid-plane 108 is left unterminated. As described hereinabove, EMI can propagate on the unterminated connector portions 104, which can cause problems such as missing or erroneous data in blades connected to mid-plane 108 or other susceptible components outside of server system 100. Terminating device 102 is coupled to server system 100 by mating connector portion 104 to connector portion 106 to help prevent EMI emissions by terminating one or more transmit lines coupled to connector portion 104.

One chassis to support server system 100 is the commercially available compact peripheral component interconnect (cPCI) Blade Server Chassis, Model Number bh7800, from Hewlett-Packard Company in Palo Alto, Calif. While server system 100 is used as an example herein, it is anticipated that various embodiments of the present invention can be utilized in various types of systems where unterminated connector portions can emit EMI.

In some embodiments, terminating device 102 can include passive electronic components, such as resistors, that are sized based on the impedance of transmit lines coupled to connector portion 104. Other conductive lines coupled to connector portion 104 can also be terminated in addition to transmit lines, with the size of the components in terminating device 102 being based on the impedance of the corresponding lines that are coupled to connector portion 104. Terminating device 102 can be embodied using various platforms and components, such as the examples described in the discussion of FIGS. 3A through 5C herein.

In the embodiment shown, server system 100 supports various components attached to various types of blades connected to mid-plane 108. In some embodiments, a chassis for server system 100 can support dual power grids (not shown), redundant paths to system management blade 110, FC storage blade 111, server blade 112, redundant fiber channel buses via FC-AL hub blade 114, Integrated Drive Electronics (IDE) storage blade 116, cooling fans (not shown); redundant network blades 118; and load-balanced power supplies (not shown). Server system 100 supports a variety of configurations of different types of blades, or entirely of one type of blade.

Mid-plane 108 provides one or more communication busses 120 for the blades in server system 100 and includes one or more connector portions 104 for each slot in the chassis. For example, when server system 100 utilizes the cPCI bus standard, connector portion 104 is included in each slot of mid-plane 108 for all power, ground, 32 bit, and 64 bit PCI signals. Components on the blades are coupled to corresponding connector portions 106. These optional connectors can be used for a variety of purposes such as a bridge to other communication buses in mid-plane 108.

In some embodiments, mid-plane 108 also includes an EEPROM that allows mid-plane 108 to identify itself to system management blade 110 for inventory and configuration tracking, and an FET (field effect transistor) for each slot that allows the blades to operate when system management blade 110 is removed. Industry-standard Ethernet, SCSI, and Fiber Channel (FC) interfaces to mid-plane 108, as well as other interfaces, can be utilized.

System management blade 110 performs a central role including event reporting, configuration and inventory management, hot-swap control, and provides local panel and network operations center (NOC) console user interfaces. In some embodiments, all blades can function normally if system management blade 110 fails or needs to be hot-swapped, allowing replacement of system management blade 110 without a loss of service from the other blades in the chassis.

Figure 2A:
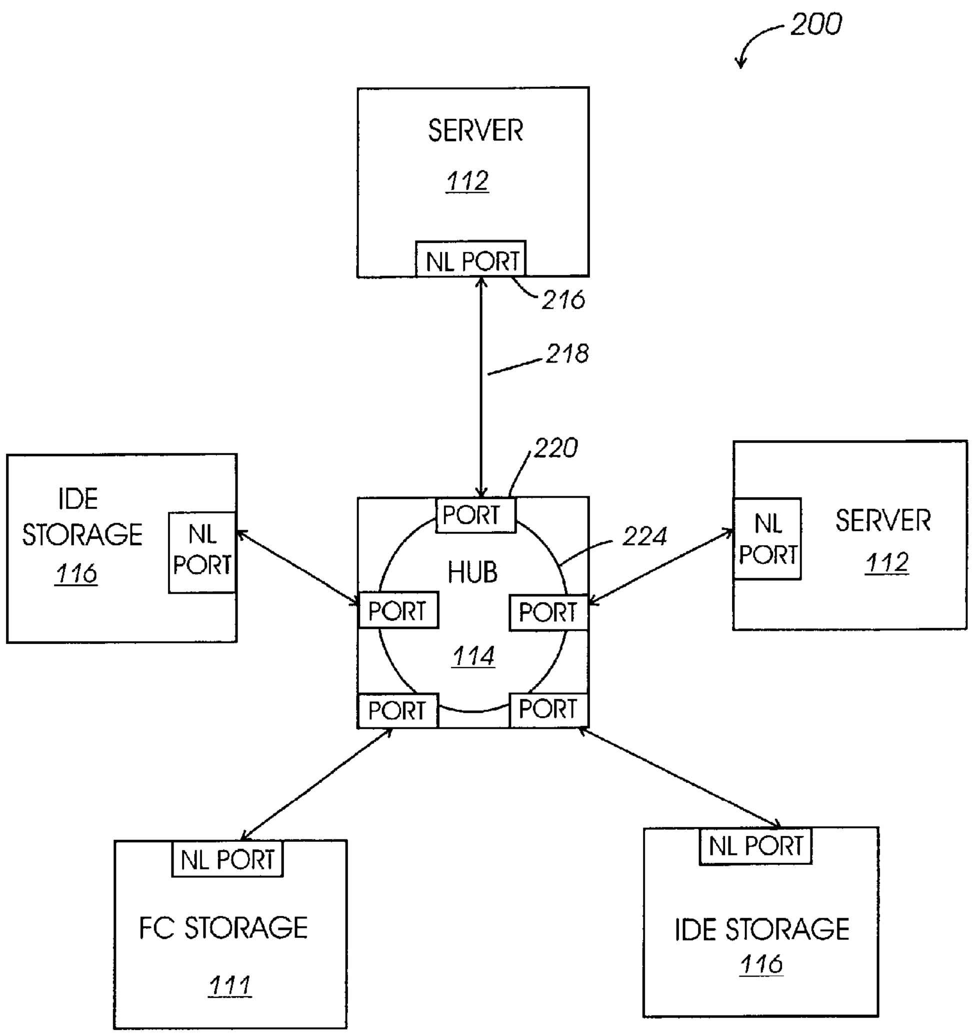
FIG. 2A is a diagram of an example of a fiber channel arbitrated loop network in which various embodiments of the present invention can be utilized.

FC storage blade 111 provides storage medium that can be accessed by devices on nodes that are part of FC-AL network 200 (FIG. 2A).

Server blades 112 can include a range of components from a complete server with on-board storage memory to one or more high-performance reduced instruction set computing (RISC) processors.

Fiber Channel Arbitrated Loop (FC-AL) hub blade 114 enables the use of fiber channel buses embedded in mid-plane 108 and a FC connection to one or more FC-enabled blades via connector portions 104. FC-AL hub blade 114 can be implemented with port bypass circuits, such as PBC 240 (FIG. 2B) as described herein to provide fiber channel arbitrated loop capability.

Integrated Drive Electronics (IDE) storage blade 116 provides redundant arrays of independent disks (RAIDs) to store the same data redundantly on multiple hard disks, thereby improving fault tolerance and reliability. IDE storage blade 116 can typically store large amounts of data and can be accessed via mid-plane 108 by server blades 112 having an appropriate interface.

Network blade 118 provides an interface between a local area network and a wide area network, typically via an Ethernet interface. Network blade 118 includes components that perform tasks such as routing, prioritization, security, bandwidth management, and network management. A console connected to network blade 118 can provide user interfaces to monitor and control hubs, switches, ports, and traffic over a network.

Referring now to FIG. 2A, a block diagram of an example of a fiber channel arbitrated loop (FC-AL) network 200 is shown with which various embodiments of the present invention can be utilized. While FC-AL network 200 is used as an example herein, it is anticipated that various embodiments of the present invention can be utilized with any type of device, server, network (including peer-to-peer and wide area networks), or other systems where unterminated connector pins can cause EMI. Various embodiments of the present invention can also be utilized in any type of system that utilizes data transfer infrastructure and protocols instead of, or in addition to, fiber channel.

FC-AL network 200 can provide high bandwidth data transfer between up to one-hundred and twenty-six devices. In some embodiments, FC-AL network 200 allows multiple devices, each called "a node," to be connected together. A node may be any device or group of devices, such as computer workstations (not shown), FC storage 111, server 112, storage disk arrays 116, tape libraries (not shown), and/or printers (not shown), having an interface that allows the node to be connected to FC-AL network 200.

Each node communicates with all other nodes on FC-AL network 200. During initialization of FC-AL network 200, each device is assigned an address. These addresses may be assigned in various ways including manually, dynamically, or by wiring the rear of the rack where the devices are installed. When a device is ready to transmit data, the device transmits its address onto FC-AL network 200. When the sending device receives its own address, the device becomes the master of the FC-AL network 200 and can communicate with the addressee. FC-AL network 200 therefore supports one active connection between two devices at a time, so control of the FC-AL network 200 must be arbitrated, usually according to priority, when more than one device requests a connection.

Each node has at least one port, referred to as node-loop (NL) port 216, to provide access to other nodes. NL ports 216 are the connections in a fiber-channel node through which data may pass over the fiber channel to NL ports 216 of other nodes. A typical fiber-channel drive has two NL ports 216 packaged within the drive's node. Each NL port 216 includes a pair of "fibers"—one to carry information into NL port 216 and one to carry information out of NL port 216. Each "fiber" is a serial data connection, and, in one embodiment, each fiber is a coaxial wire (e.g., coaxial copper conductors, used when the nodes are in close proximity to one another); in other embodiments, a fiber is implemented as an optical fiber over at least some of its path (e.g., when nodes are separated by an appreciable distance, such as nodes in different cabinets or, especially, different buildings). The pair of fibers connected to each NL port 216 is referred to as a link 218. Links 218 carry information or signals packaged in "frames" between nodes. Each link 218 can handle multiple types of frames (e.g., initialization, data, and control frames). One example of a link is bus 120 (FIG. 1)

Each node is directly attached to one of hub ports 220 of FC-AL hub blade 114 by link 218. Arbitrated loop 224 is typically implemented inside FC-AL hub blade 114. Generally, FC-AL hub blade 114 will have between seven to ten ports 220, and a maximum number of devices, e.g., one-hundred twenty-six devices, can be connected to arbitrated loop 224 by linking several hubs 114 together.

Figure 2B:
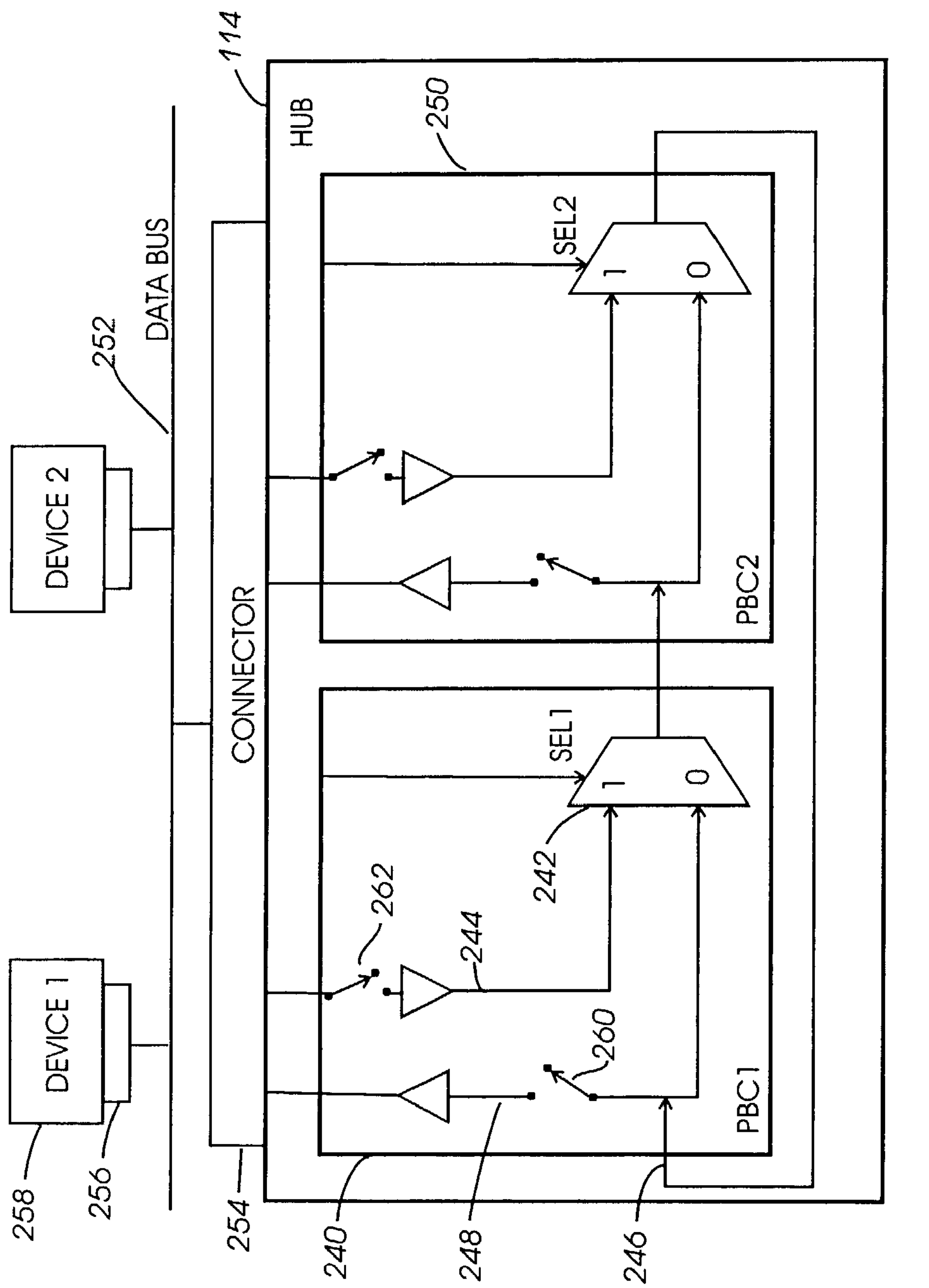
FIG. 2B is a diagram of an example of a dual port bypass circuit which can be utilized in the fiber channel arbitrated loop network shown in FIG. 2A.

An advantage of FC-AL hub blade 114 is that each hub port 220 includes port bypass circuit (PBC) 240, such as shown for example in FIG. 2B. If hub port 220 detects that a device is absent or not responding, hub port 220 closes PBC 240, thereby preserving the continuity of arbitrated loop 224. PBC 240 prevents a failing device or connection from bringing down the entire arbitrated loop 224 and also allows hot-swapping, which is the ability to add and remove devices while arbitrated loop 224 is active. An example of PBC 240 suitable for use in arbitrated loop 224 is port bypass circuit model number VSC7148, which is commercially available from Vitesse Semiconductor Corporation in Camarillo, Calif.

In the example of PBC 240 shown in FIG. 2B, PBC 240 includes a multiplexer 242 that is controlled by the SEL1 line. When an operational device 258 is in communication with hub port 220 (FIG. 2A), the SEL1 line is set HIGH, and external input line 244 is selected. Otherwise, the SEL1 line is set LOW and output line 246 of previous PBC 250 is selected since there is no connected or functional device that can provide input to hub port 220.

FC-AL hub blade 114 and device 258 interface with data bus 252 via connectors 254, 256, respectively. Transmit line 248 transmits data to the corresponding device 258 via data bus 252. PBC 240 includes several registers that can be set via an application programmer interface (API) to PBC 240 to control operation of components in PBC 240 such as transmit enable switch 260 and receive enable switch 262. In general, FC-AL hub blade 114 toggles SEL1 to bypass device 258 when device 258 is disconnected, while transmit enable switch 260 and receive enable switch 262 remain closed.

One problem that arises when output line 246 of previous PBC 250 is selected is that the data is transmitted not only to multiplexer 242, but also along transmit line 248. Lines coupled to connector 254, such as transmit line 248, carrying data with fast edge rates or that are continuously active, such as clocks or data lines, should be terminated. Additionally, a line may pick up and transmit noise from other lines. When device 258 is not connected to data bus 252, transmit line 248, as well as other lines coupled to connector 254 that are capable of conducting noise signals, should be terminated when they are "long" compared to the wavelength of the applied frequency of the signal. If transmit line 248 is not terminated in its characteristic impedance, a signal reflection will occur. The amplitude of the reflection depends on the amount of impedance mismatch between transmit line 248 and the load, which is infinite when transmit line 248 is not terminated. The amplitude of the reflection also depends on the rise time of the signal as well as the rise time of the signal compared to the length of the conductor in transmit line 248. It is also desirable to terminate other lines coupled to connector 254, such as receive line 262, that are capable of conducting noise signals.

When device 258 is disconnected from connector 256, the portion of connector 256 coupled to data bus 252 is typically left open. In the presence of signals at the appropriate frequency and amplitude, pins on the portion of connector 256 can act as antennae, radiating EMI that can disrupt operation of other devices within susceptible range.

Figure 3B:
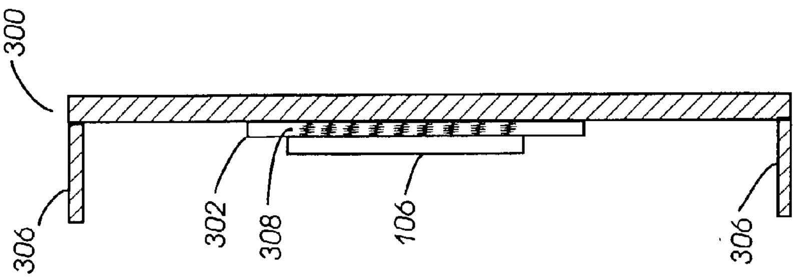
FIG. 3B is a side cross-sectional view of the airflow guide and terminating resistor circuit shown in FIG. 3A.
Figure 3A:
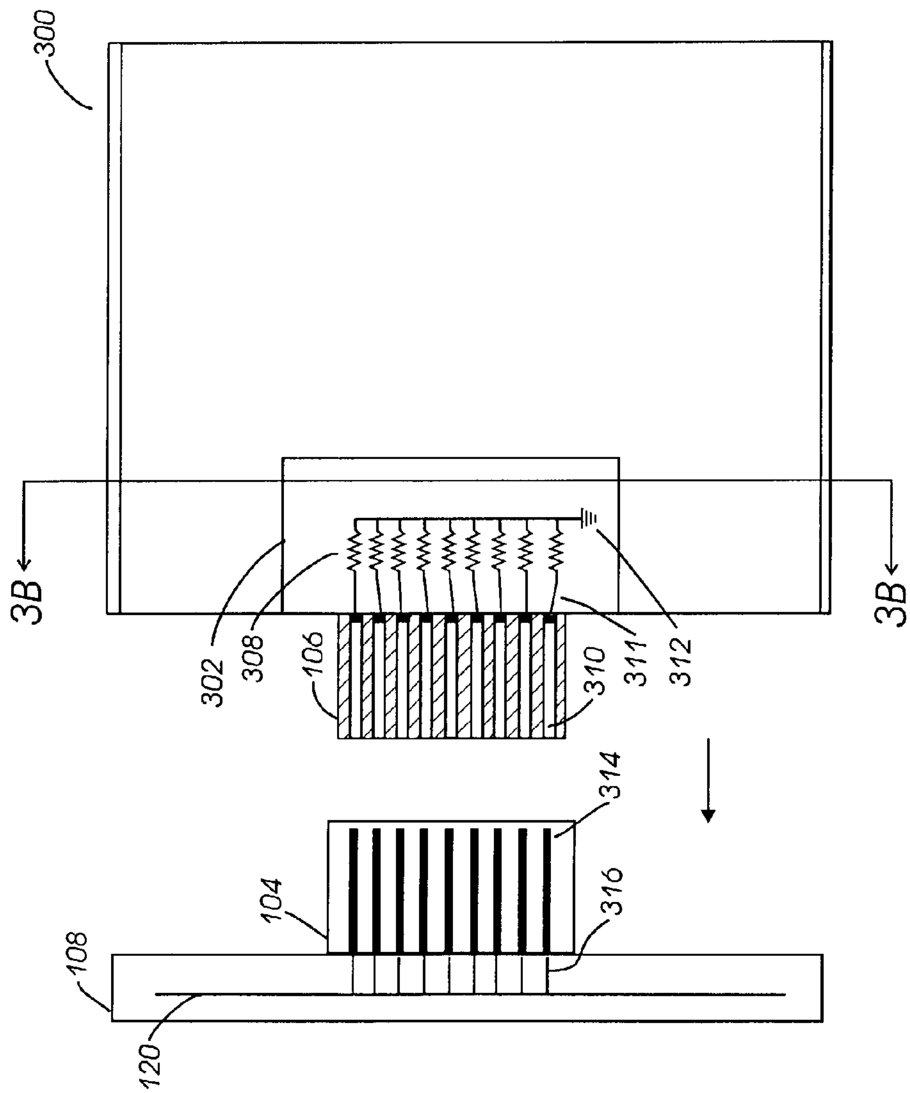
FIG. 3A is a cross-sectional view of an example of a terminating device including an airflow guide on which a circuit of terminating resistors is coupled to a cross-section portion of a connector in accordance with an embodiment of the present invention.

Referring now to FIGS. 3A and 3B. FIG. 3A shows a cross-sectional view of an example of terminating device 102 (FIG. 1) including airflow guide 300 on which terminating circuit 302 is coupled to connector portion 106 in accordance with an embodiment of the present invention. FIG. 3B is a side cross-sectional view of airflow guide 300 and terminating circuit 302 shown in FIG. 3A. Airflow guide 300 is typically a null device that does not require management oversight by system management blade 110 (FIG. 1). Terminating circuit 302 can be fastened to airflow guide 300 using any suitable fastening method, such as mechanical fasteners or adhesives. In one embodiment, airflow guide 300 is sized similar to the other blades in server system 100 (FIG. 1). Airflow guide 300 can include flanges 306 to deflect cooling airflow toward other blades that include active electronic components.

It is anticipated that any connector type that propagates unwanted signals when left unterminated can be utilized with various embodiments of the present invention. For example, connectors such as a DB-9 connector, which is used for a variety of purposes such as RS-232 (serial) connections and video interfaces; compact peripheral component interconnect (cPCI) connectors; high speed serial device (HSSD) connector; the DB-25 connector (commonly used for RS-232 (serial) connections, parallel printer interfaces, and for SCSI connections); the HD-DB-15 pin connector (commonly used for VGA monitors); the PCI connector (used to connect peripheral cards to computer motherboards); and a variety of other connectors, are a few of the other types of connectors with which various embodiments of the present invention can be utilized.

Connector portion 106 includes sockets, such as socket 310, which are formed in an electrically nonconductive base and lined, at least partially, with an electrically conductive material (not shown). One end of conductive wire 311 can be soldered or otherwise suitably coupled in contact with the electrically conductive lining in socket 310. In the embodiment, shown, the other end of conductive wire 311 is coupled to one of resistors 308.

Connector portion 104 includes one or more electrically conductive pins, such as pin 314. One end of conductive wire 316 can be soldered or otherwise suitably coupled in contact with pin 314. The other end of conductive wire 316 is coupled to a communication bus, such as bus 120.

When connector portion 104 at the end of transmit line 248 (FIG. 2B) is unterminated, the most significant effect is the introduction of signal reflections onto transmit line 248. A signal propagating down a transmit line 248 will be reflected back towards the source if the outbound signal encounters a mismatch in line impedance at the far end, such as unterminated connector portion 104. The result is a signal reflection back towards the driver, such as FC-AL hub blade 114 (FIG. 1). This reflection then encounters another impedance mismatch at FC-AL hub blade 114, which in turn generates additional reflections back toward connector portion 104, and so on. The net result is a number of reflections propagating back and forth between FC-AL hub blade 114 and connector portion 104. Additionally, open pins 314 can act as antennae, which radiate the signal coupled to them on transmit line 248. The result is a strong noise signal, or EMI, being efficiently propagated by one or more open pins 314. This EMI may result in erroneous transmission of data, lost data, or a reduction in the amount of acceptable noise for the overall system.

In some embodiments, terminating circuit 302 includes a series of surface-mounted resistors 308, with one lead of each resistor 308 being coupled in electrical contact with a corresponding socket 310 in connector portion 106. The other lead of each resistor 308 is coupled to ground 312. The impedance of each resistor 308 is based on the characteristic impedance of the transmit line it will terminate. Notably, signals with high frequency harmonics can exist on any conductive lines 316 that are coupled to connector portion 104. Accordingly, in some embodiments, terminating circuit 302 can be configured to terminate some or all of the other lines 316 coupled to connector portion 104.

When airflow guide 300 is inserted into an open slot, the sockets 310 in connector portion 106 mate with corresponding pins 314 in connector portion 104 residing on mid-plane 108.

Note that in some embodiments, connector portion 104 can reside on any type of device such as mid-plane 108, a backplane (not shown), or a stand-alone device (not shown). Further, various other passive electronic components that are capable of substantially matching the impedance of lines 316 coupled to connector portion 104 can be utilized in terminating circuit 302, instead of, or in addition to, resistors 308 either alone or in combination with other components.

Figure 4B:
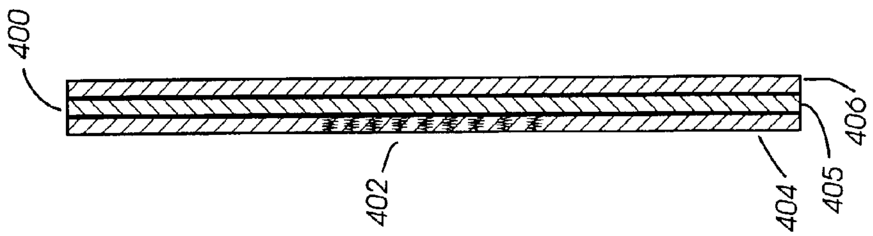
FIG. 4B is a side cross-sectional view of the printed circuit board and terminating circuit shown in FIG. 4A.
Figure 4A:
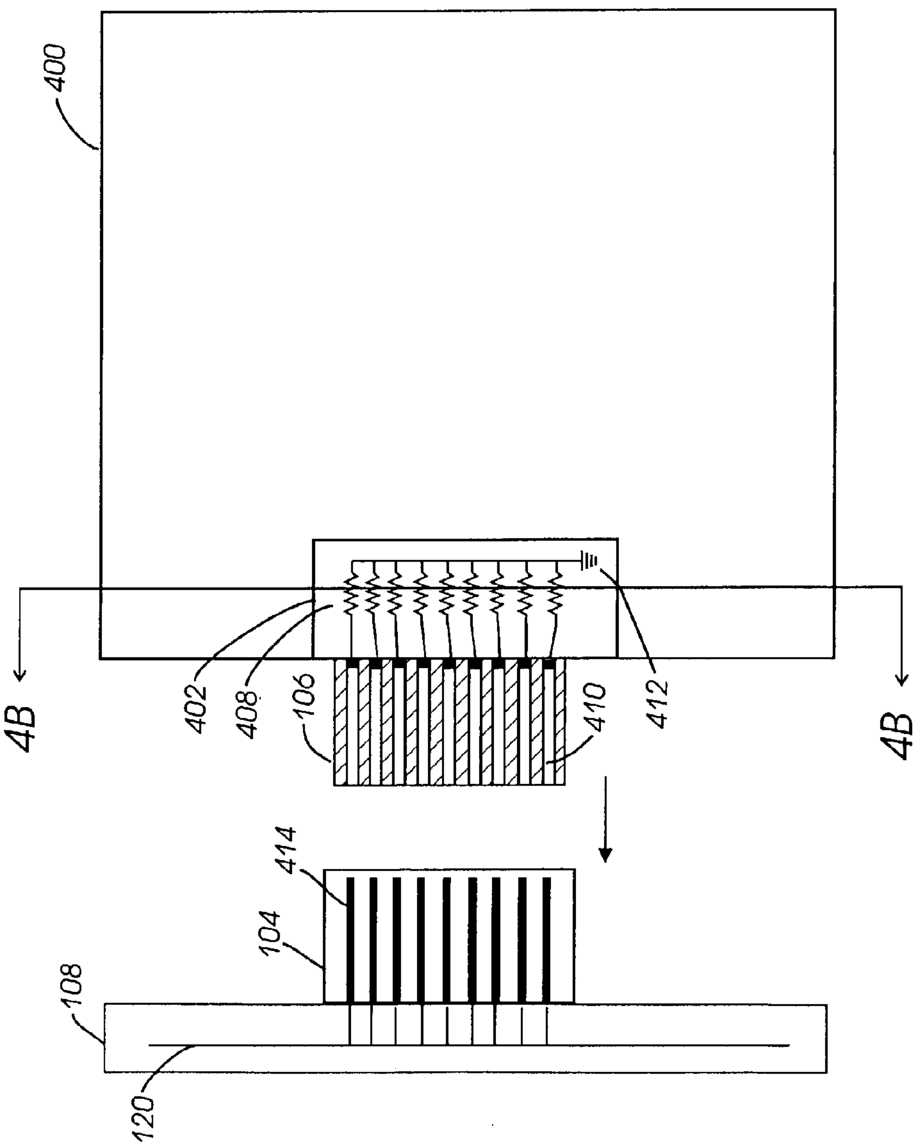
FIG. 4A is a cross-sectional view of an example of another terminating device including a printed circuit board with a built-in terminating circuit coupled to a connector portion in accordance with an embodiment of the present invention.

Referring now to FIGS. 4A and 4B, FIG. 4A shows a cross-sectional view of another example of terminating device 102 (FIG. 1) including printed circuit board 400 with built-in terminating circuit 402 coupled to connector portion 106 in accordance with another embodiment of the present invention. FIG. 4B is a side cross-sectional view of printed circuit board 400 and terminating circuit 402 shown in FIG. 4A. Terminating circuit 402 can include components that are surface mounted on a single-sided, double-sided, or multi-layer printed circuit board 400 using any suitable materials and manufacturing methods. Additionally, terminating circuit 402 can include components that are embedded in one or more layers 404, 405, 406 of printed circuit board 400 again using any suitable materials and manufacturing methods. A combination of surface-mounted and embedded components can also be utilized in terminating circuit 402.

In some embodiments, printed circuit board 400 is sized similar to the size of other types of blades and can be inserted in an unoccupied slot in server system 100 (FIG. 1). Other circuits in addition to terminating circuit 402 can be included on or embedded in various embodiments of printed circuit board 400. In other embodiments, terminating circuit 402 can be mounted on or embedded in a smaller printed circuit board 400 that is mounted to another structure, such as airflow guide 300 (FIG. 3A) or another blade, that can be inserted in an unoccupied slot in server system 100 (FIG. 1).

Notably, mounting one or more terminating circuits 402 on a blade may allow connector portions 104 on mid-plane 108 to be configured identically for all slots, while providing termination for the pins that are not used by a particular blade.

In some embodiments, terminating circuit 402 includes a series of resistors 408, with one lead of each resistor 408 being coupled in electrical contact with a corresponding socket 410 in connector portion 106. The other lead of each resistor 408 is coupled to ground 412 in printed circuit board 400. The impedance of each resistor 408 is based on the characteristic impedance of the line that it will terminate. Notably, signals with high frequency harmonics can exist on any lines that are coupled to connector portion 104, therefore, in some embodiments, some or all of the other lines coupled to connector portion 104 can also be terminated.

When printed circuit board 400 is inserted into an open slot, the sockets 410 in connector portion 106 mate with corresponding pins 414 in connector portion 104 residing on mid-plane 108. Note that in other embodiments, connector portion 104 can reside on any type of device such as a backplane or a stand-alone device. Further, various other passive electronic components that are capable of matching the impedance of the lines 316 connected to connector portion 104 can be utilized in terminating circuit 402, either alone or in combination with other components, instead of, or in addition to, resistors 408. In still other embodiments, just one resistor 408 or other component(s) selected to match the impedance of all the lines 316 to be terminated can be utilized instead of a series of components. In still other embodiments, multiple terminating components, such as resistors 408, can be utilized, with one or more of the components each being configured to terminate two or more lines 316.

Figure 5B:
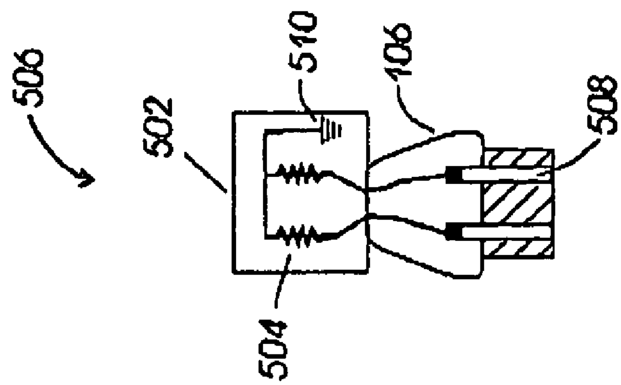
FIG. 5B is a side cross-sectional view of the connector portion shown in FIG. 5A.
Figure 5A:
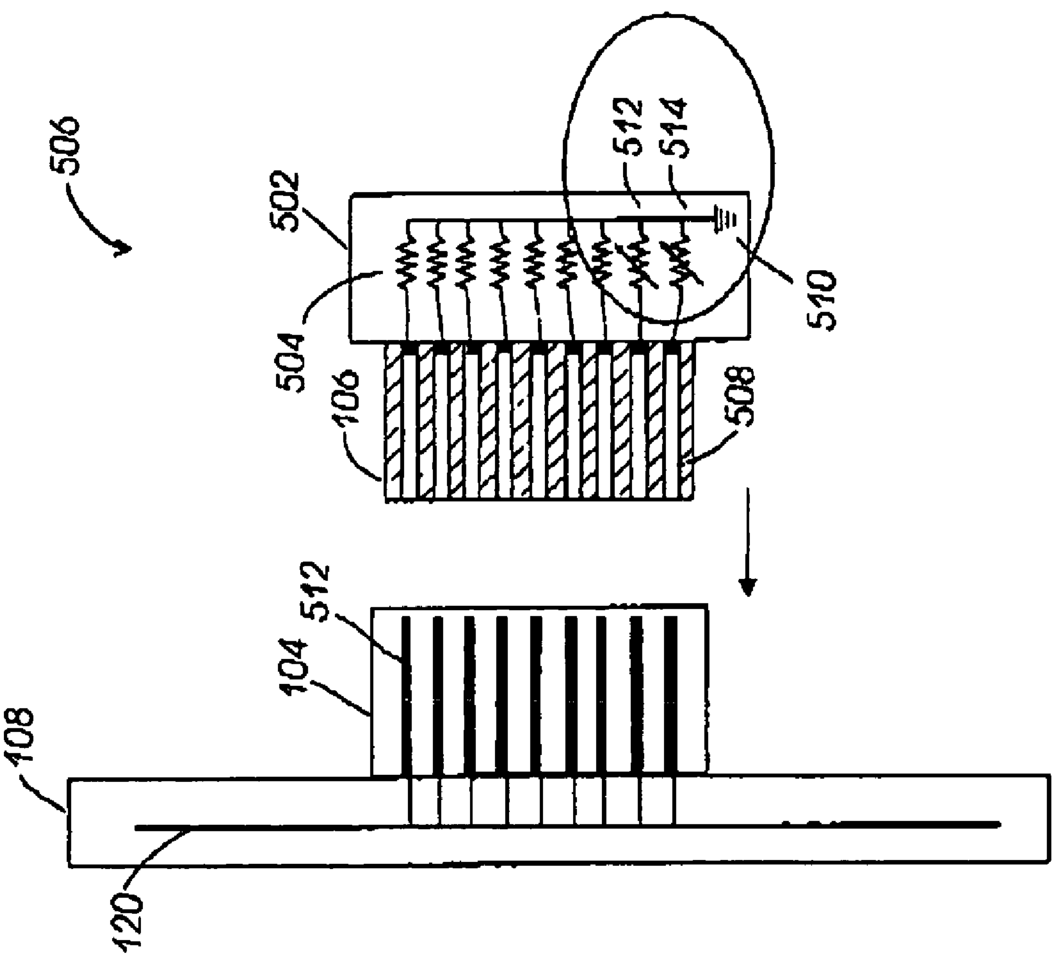
FIG. 5A is a cross-sectional view of another example of a terminating device including a circuit of terminating resistors built in to a connector portion in accordance with an embodiment of the present invention.

Referring now to FIGS. 5A and 5B, FIG. 5A is a cross-sectional view of another example of terminating device 102 (FIG. 1) including terminating circuit 502, shown as a series of resistors 504, built in to connector portion 506 in accordance with an embodiment of the present invention. FIG. 5B is a side cross-sectional view of the connector portion 506 and terminating circuit 502 shown in FIG. 5A. Sockets 508 in connector portion 506 mate with pins 512 in connector portion 104 residing on mid-plane 108. Note that in other embodiments, connector portion 104 can reside on any type of device such as a backplane or a stand-alone device.

Terminating circuit 502 can include individual components, such as thick or thin film resistors, with one lead of each resistor 504 being coupled in electrical contact with a corresponding socket 508 in connector portion 506. The other lead of each resistor 504 is coupled to ground 510. The impedance of each resistor 504 is based on the characteristic impedance of the line it will terminate. Some or all of the other lines coupled to connector portion 106 can also be terminated since signals with high frequency harmonics can exist on any lines that are coupled to connector portion 106.

In some embodiments, terminating circuit 502 can be included in a small printed circuit board (not shown) that is enclosed in connector portion 506. The components of terminating circuit 502 can be surface mounted on a single-sided, double-sided, or multi-layer printed circuit board using any suitable materials and manufacturing methods. Additionally, terminating circuit 502 can include components that are embedded in one or more layers of a printed circuit board, again using any suitable materials and manufacturing methods, instead of or in addition to, surface mounted components. A combination of surface-mounted and embedded components can also be utilized.

Further, various other passive electronic components instead of, or in addition to, resistors 504, that are capable of substantially matching the impedance of the lines 316 connected to connector portion 104 can be utilized in terminating circuit 502.

In still other embodiments, just one resistor or other component selected to substantially match the impedance of all the lines to be terminated can be utilized instead of a series of components.

In another embodiment, one lead of a resistor can be coupled to the HIGH line of a pair of differential transmission lines, and the other lead of the resistor can be coupled to the LOW line of the differential pair. The value of the resistor in such an embodiment is approximately twice the value of the characteristic impedance of a single line. Additionally, the resistor would not be coupled to ground.

In still other embodiments, multiple terminating components, such as resistors 504, can be utilized, with one or more of the components each being configured to terminate two or more lines.

Further, one or more adjustable resistors 512, 514 and/or other components can be used to allow connector portion 106 or be used with different connector portions 104 to terminate lines having different impedances.

The ability to reduce or even eliminate EMI generated by unterminated transmission lines coupled to an open connector portion using a terminating circuit coupled to a corresponding connector portion provides a very flexible and convenient solution. The terminating circuits can be implemented in a wide variety of structures that can be easily removed when an operational blade or other device is to be connected in server system 100 (FIG. 1). Terminating devices 102 (FIG. 1) in accordance with embodiments of the present invention can also be included in an operational blade or other plug-in board to terminate portions of a connector on a mid-plane, backplane, or other device that are not utilized by the blade.

It is also important to note that since connector portion 106 with sockets 508 can be coupled to other conductive lines, connector portion 106 may also propagate EMI. Such would be the case, for example, where connector portions 106 with sockets 508 were included on mid-plane 108. In such situations, terminating device 102 can be coupled to the pins 512 of connector portion 104 to terminate one or more electrically conductive lines attached to connector portion 106.

While the invention has been described with reference to various embodiments, it will be understood that these embodiments are illustrative and that the scope of the invention is not limited to them. Many variations, modifications, additions and improvements of the embodiments described are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the invention. Variations and modifications of the embodiments disclosed herein may be made based on the description set forth herein, without departing from the scope and spirit of the invention as set forth in the following claims.

In the claims, unless otherwise indicated the article "a" is to refer to "one or an one".

What is claimed is:

1. An apparatus for terminating a transmission line comprising:

a first connector portion comprising an electrically conductive portion, wherein the first connector portion is couplable to communicate electrically with a second connector portion, the second connector portion being coupled in electrical contact with the transmission line, wherein the transmission line is coupled to a loop in a hub; and a terminating circuit mounted on the first connector portion in electrical contact with the electrically conductive portion of the first connector portion.

2. The apparatus according to claim 1 wherein:

the terminating circuit substantially matches the impedance of the transmission line.

3. The apparatus according to claim 1 wherein:

the terminating circuit comprises a resistor.

4. The apparatus according to claim 1 further comprising:

a printed circuit board comprising the terminating circuit.

5. The apparatus according to claim 4 wherein:

at least a portion of the tenninating circuit is mounted on a layer of the printed circuit board.

6. The apparatus according to claim 4 wherein at least a portion of the terminating circuit is embedded in a layer of the printed circuit board.

7. The apparatus according to claim 1 further comprising:

an airflow guide comprising the terminating circuit.

8. The apparatus according to claim 1 further comprising:

a server blade comprising:

the terminating circuit; and at least one data processing component.

9. The apparatus according to claim 1 further comprising:

a server blade comprising:

the terminating circuit; and at least one data storage component.

10. The apparatus according to claim 1 wherein:

the hub utilizes an arbitrated loop protocol.

11. The apparatus according to claim 1 wherein:

the hub utilizes a fiber channel arbitrated loop protocol.

12. A computer system comprising:

a first connector portion comprising: at least one pin;

a transmission line, wherein one end of the transmission line is coupled in electrical contact with the at least one pin and the other end of the transmission line is oupled to an arbitrated loop;

a second connector portion comprising at least one socket, wherein the at least one socket includes an electrically conductive portion; and a terminating circuit mounted on the second connector portion and in electrical contact with the at least one socket.

13. The computer system according to claim 12 further comprising:

a part bypass circuit coupled to the transmission line.

14. The computer system according to claim 13 further comprising a hub, wherein the hub comprises the port bypass circuit.

15. The computer system according to claim 14 wherein the hub is operable to: receive data via optical fiber; and transmit data via electrically conductive wire.

16. The computer system according to claim 13 wherein:

the terminating circuit substantially matches the impedance of the transmission line.

17. The computer system according to claim 13 wherein:

the impedance of the terminating circuit is adjustable.

18. A method for reducing electromagnetic interference in art electronic system, wherein the electronic system includes a transmission line coupled in electrical contact to a first connector portion, the method comprising:

mounting a terminating circuit on a second connector portion; and mating the second connector portion to the first connector portion thereby reducing electromagnetic interference by terminating the transmission line with the terminating circuit.

19. The method according to claim 18 further comprising:

determining the impedance of the transmission line, wherein the terminating circuit substantially matches the impedance of the transmission line.

20. The method according to claim 19 wherein the terminating circuit comprises a resistor.

21. The method according to claim 20 further comprising:

embedding the terminating circuit in a layer of a printed circuit board.

22. The method according to claim 20 further comprising:

mounting the terminating circuit on one of the group of: a data processing component and a data storage component.

23. The method according to claim 18 wherein the transmission line is coupled to an arbitrated loop in a hub.

24. The method according to claim 18 further comprising:

mounting the terminating circuit on an airflow guide.

25. An apparatus for terminating a plurality of serial data transmission lines comprising:

a first connector portion comprising a plurality of sockets, wherein at least a portion of each of the plurality of sockets is electrically conductive; and terminating circuit means coupled in electrical contact with the plurality of sockets in the first connector portion, wherein the first connector portion is mateable to a second connector portion to reduce electromagnetic interference in at least one of the plurality of serial data transmission lines.

26. The apparatus according to claim 25 wherein:

the terminating circuit means includes a resistor.

27. The apparatus according to claim 26 wherein:

the terminating circuit means substantially matches the impedance of the transmission lines.

28. The apparatus according to claim 25 wherein:

a printed circuit board comprises the terminating circuit means.

29. The apparatus according to claim 28 wherein:

the temlinating circuit means is mounted on a layer of the printed circuit board.

30. The apparatus according to claim 28 wherein:

the terminating circuit means is embedded in a layer of the printed circuit board.

31. The apparatus according to claim 25 wherein:

the terminating circuit means comprises a plurality of circuit components.

32. The apparatus according to claim 31 wherein:

each circuit component is in electrical contact with at least one of the sockets.

* * * * *